United States Patent [19]

Walley

[11] 4,112,748
[45] Sep. 12, 1978

[54] AUTOMATIC PORTABLE SOLID STATE VOLTAGE REGULATOR TESTER

[76] Inventor: Richard J. Walley, 6392 Marshall Ave., Buena Park, Calif. 90621

[21] Appl. No.: 804,724

[22] Filed: Jun. 8, 1977

[51] Int. Cl.² .......................................... G01M 19/00
[52] U.S. Cl. .................................. 73/118; 324/158 F
[58] Field of Search ............. 73/118; 324/149, 158 F, 324/126, 76 R, 72.5, 62

[56] References Cited

U.S. PATENT DOCUMENTS

| | | | |
|---|---|---|---|
| 2,597,188 | 5/1952 | Rozett | 324/115 X |
| 3,142,797 | 7/1964 | Grant | 73/118 UX |
| 3,553,572 | 1/1971 | Harmon | 324/62 X |
| 3,921,063 | 11/1975 | Helling | 324/158 F X |

Primary Examiner—Jerry W. Myracle
Attorney, Agent, or Firm—Blair, Brown & Kreten

[57] ABSTRACT

An automatic, portable solid state voltage regulator tester, specifically made for testing Ford and General Motors regulators. The face of the tester has contacts arranged for the manual application of either of the regulators and the regulator under test is held against these contacts with the thumb. A merit switch is pressed and if the meter rises to a marked area, pauses for a moment, and then drops to zero, the regulator is satisfactory. If the meter does not rise, or if it rises but does not drop back to zero, then the regulator is defective.

4 Claims, 6 Drawing Figures

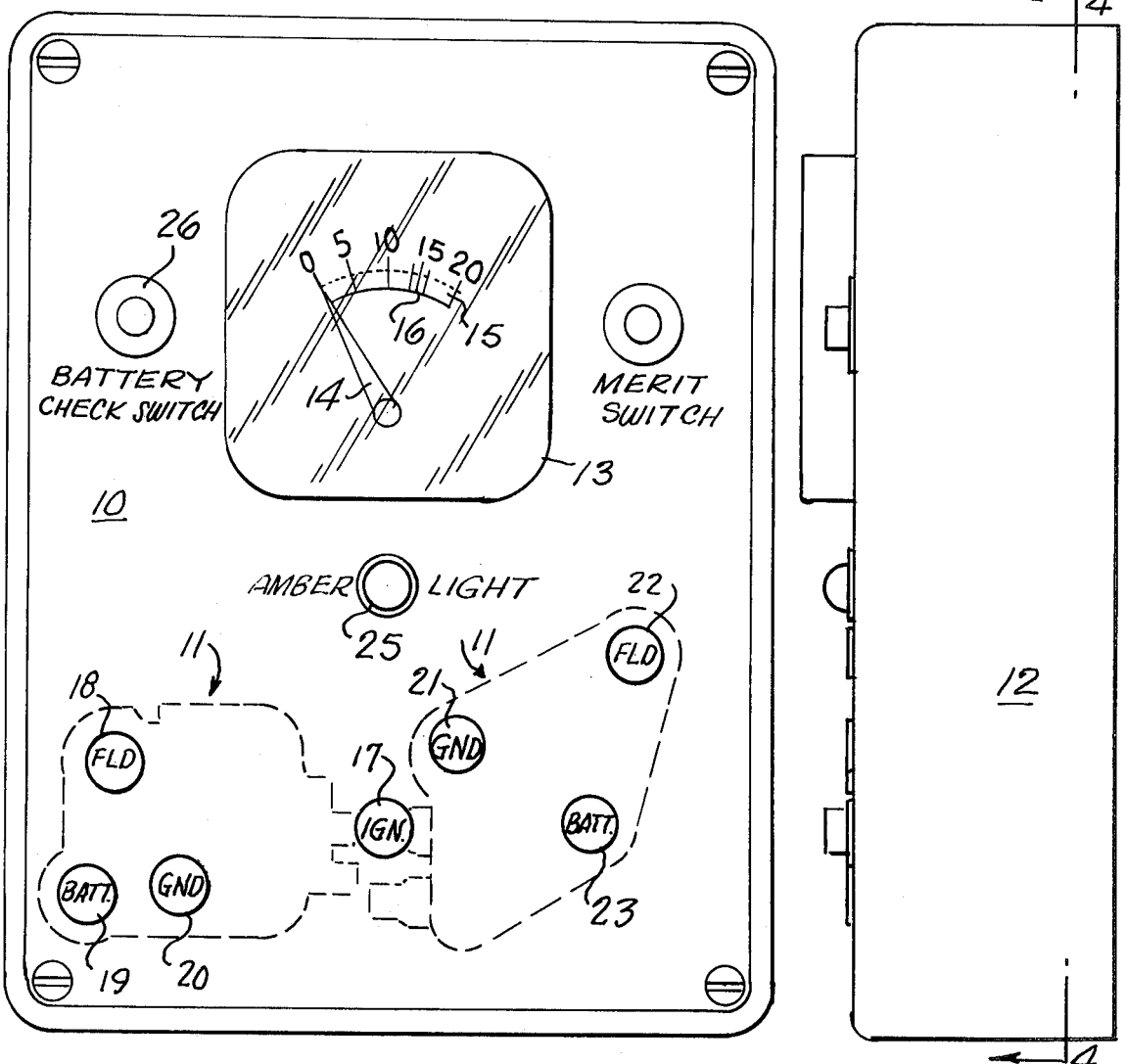
FIG. 1.
FIG. 2.
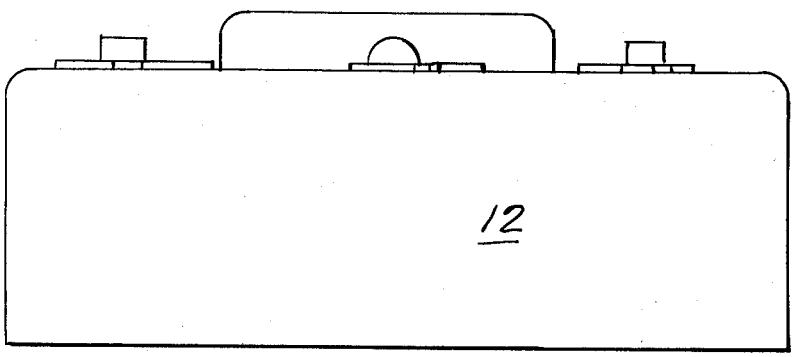
FIG. 3.

AUTOMATIC PORTABLE SOLID STATE VOLTAGE REGULATOR TESTER

BACKGROUND OF THE INVENTION

A common cause for an automobile alternator to cease charging is a defective voltage regulator. Very frequently if there is no charging, then the alternator is replaced, and when the alternator is torn down, it is found to be not defective. In some cases it has been found that solid state replacement regulators in stock are also defective. However, discovery of this is not made until after installation of the new alternator, such replacing of alternators having been unnecessary in the first place. Discovery of the defective solid state regulators has been due to the fact that the conventional testing methods with existing apparatus has been quite time consuming. Therefore, usually no attempt is made to verify the working condition of the solid state device prior to installation. Also, when Ford and General Motors inspectors visit dealers for the purpose of checking warranty parts they are unable to verify the state of the solid state voltage regulator, again due to the time consuming process now required for testing. The simplified test will enable rapid testing of the entire stock to ensure reliable and dependable replacement parts, saving the dealer and consumer time and costs.

FIELD OF THE INVENTION

The present invention relates to an automatic portable solid state voltage regulator tester.

SUMMARY OF THE INVENTION

The present invention of an automatic portable solid state voltage regulator tester includes a battery operated, light weight unit and requires no test leads or hand tools for the testing. The voltage regulator under test is held in place against contacts on the surface of the tester with the pressure of one finger while a merit push-button switch is pressed with the other hand. The merit switch is held down until the meter needle stops moving (should be about a second). When the merit switch is released, the test completion light will glow, momentarily. When the light turns off the test may be repeated by pressing the merit switch again. In making the test if the meter needle moves to green and then falls back to zero, the regulator is good. If the needle moves to the red area (on either side of green) and does not fall back, then the regulator is shorted and defective. If the needle does not move off zero, then the regulator is defective and open.

A battery test must be made to ensure that the tester is powered with at least 15 volts as required to properly test the voltage regulator. To test the batteries, simply press, simultaneously both the merit and battery switches.

The primary object of the invention is to provide an automatic, portable solid state voltage regulator tester which has a simple procedure, coupled with the low cost of the instrument, and one which is battery operated to provide quick, reliable, efficient, and professional, quality testing of solid state voltage regulators made by Ford and General Motors.

Other objects and advantages will become apparent in the following specification when considered in light of the attached drawings.

BRIEF DESCRIPTION OF THE DRAWINGS

FIG. 1 is a plan view of the front face of the tester;
FIG. 2 is a side elevation of the tester case;
FIG. 3 is an end elevation of the tester case.

DESCRIPTION OF THE PREFERRED EMBODIMENT

Figure 4:
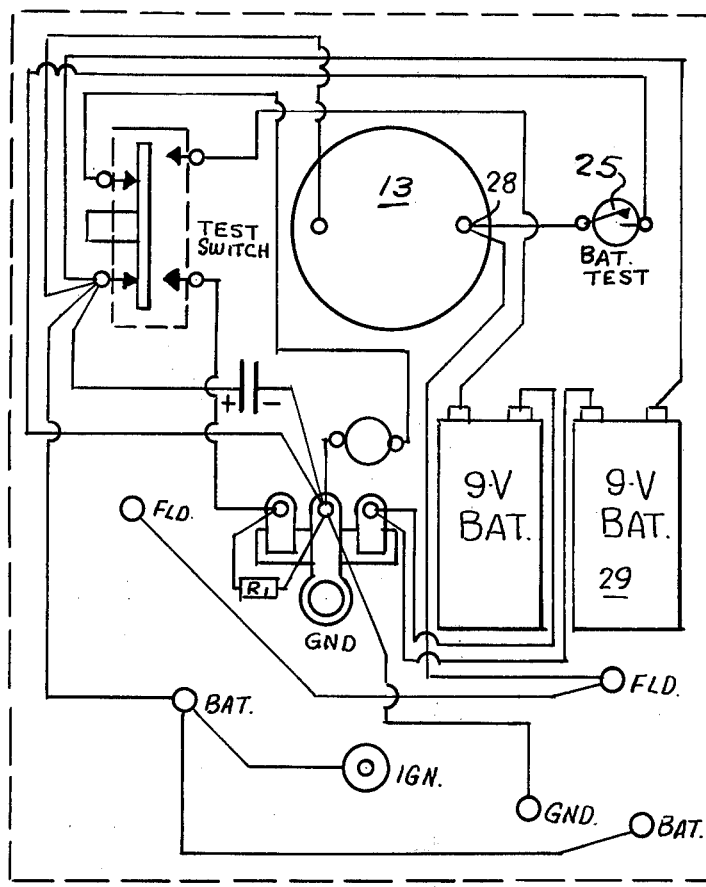
FIG. 4 is a view taken along the line 4—4 of FIG. 2 looking in the direction of the arrows.

Referring now to the drawings in detail, wherein like reference characters indicate like parts throughout the several figures, the reference numeral 10 indicates generally the tester making up the invention, while the reference numeral 11 indicates generally a solid state voltage regulator being tested, whether it be a Ford or General Motors product. A quick referral to FIG. 6 will show that the left side of the structure is the voltage regulator, while the right side is the tester, forming the basis for the invention.

The tester 10 is carried in a case 12 which has on its front face a meter 13, the meter 13 having a moving needle 14 and a voltage scale 15, and the scale 15 containing a specifically marked and colored area 16 which indicates a proper reading for the regulator under test.

Near the bottom of the face of case 12 there are a series of metallic contacts, permanently mounted in the case, for use in testing specific regulators. The contacts are specifically spaced and wired so that the regulator in question may be pressed against these contacts to complete specific electric circuitry characteristic with that particular regulator.

The group of contacts to the left comprise 17 in the center, then 18, 19 and 20. As will be seen hereinafter, contact 17 is connected to ignition, 18 to field, 19 to battery, and 20 to ground. This arrangement is directed to a Ford regulator.

The group of contacts to the right comprise contacts 17 (common), 21, 22 and 23. This time 17 is again for ignition, 21 is ground, 22 is field, and 23 is battery. This arrangement is specific to a General Motors regulator.

Just to the right of meter 13 there is a push-button merit switch 24 which is depressed to make a routine test, while below there is an amber light 25. The tester being portable it is naturally battery operated, but to guarantee accuracy the strength of its batteries should be read before a test. To do this there is a battery check switch 26, also on the front of the case 12.

Figure 5:
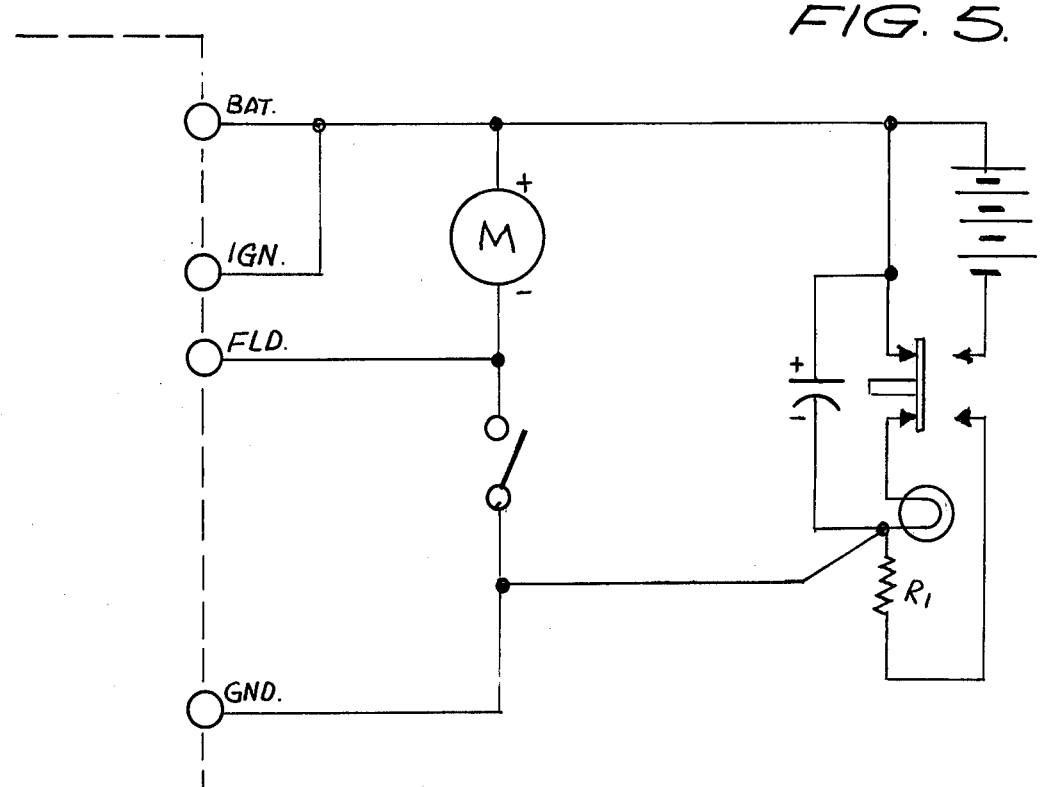
FIG. 5 is an electrical schematic of the tester apparatus.

Turning now to the electrical schematic of the tester (FIGS. 4 and 5) it can be seen that the apparatus consists of two sets of four interconnecting terminals to the regulator to be tested. Each set includes the ignition terminal 17, and the field terminals 18, 22, the battery terminals 19, 23, and the ground terminals 20, 21. As seen in FIG. 4, each set is appropriately positioned to accomodate the Ford and General Motors regulators. Ignition terminal 17 is connected to battery terminals 19, 23, which in turn are connected to the positive terminal of the battery 27. The field terminals 18, 22 are connected to the negative terminal 28 of the meter 13. Ground terminals 20, 21 are connected together.

The negative terminal of battery 27 is connected to the positive terminal of battery 29, these two batteries being 9 volts each, and in series, provides a maximum of 18 volts.

The negative terminal of battery 29 is connected to the normally open contact 30 of merit switch 24. One of the normally closed contacts 31, of merit switch 24 is connected to the positive terminal of battery 27. The other normally closed contact 32, of merit switch 24 is connected to lamp 25, which in turn goes to the junction of a capacitor 33 and a resistor 34. The positive lead of capacitor 33 goes to the positive terminal of battery 27. The other lead of capacitor 33 is connected to ground.

The negative terminal 28, of meter 13 is connected to one contact of battery switch 26 while the other contact is connected to ground.

Figure 6:
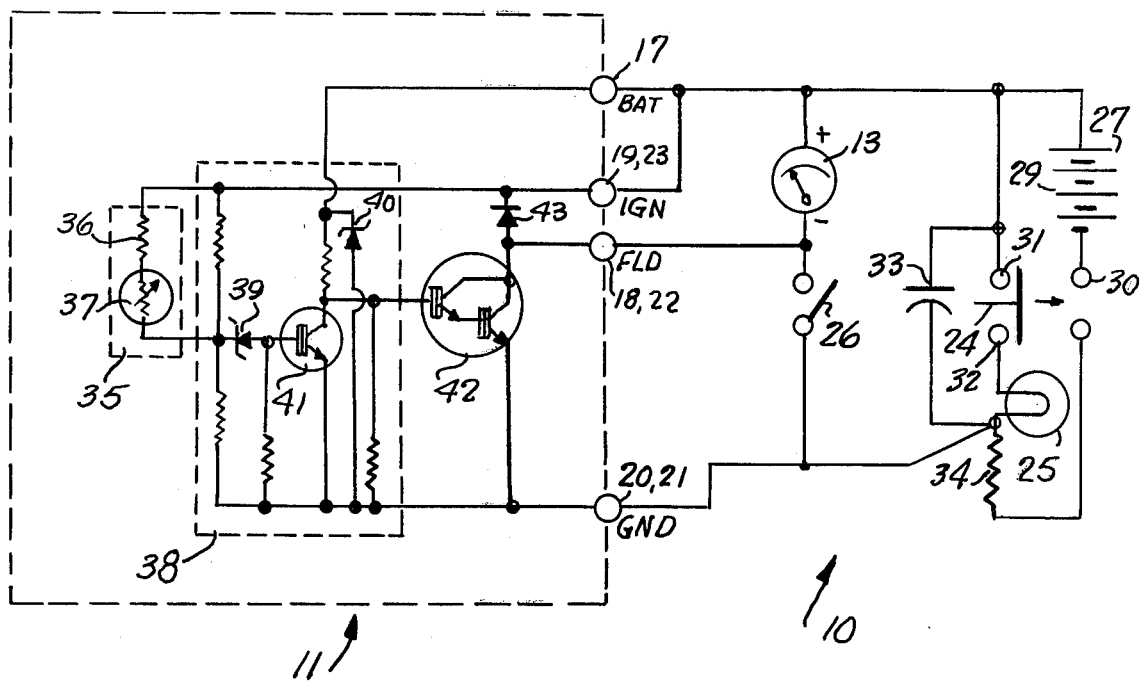
FIG. 6 is an electrical schematic of the tester with a solid state voltage regulator connected to it.

Turn briefly to FIG. 6 to see where schematically a unit regulator 11 is connected to a tester 10, and observe what parts typically make up one of the regulators 11. There is shown a temperature compensation device 35 which has a dropping resistor 36 and a thermostat 37. Next is a voltage control device 38 which has, among other standard components, a zener diode 39, a transient suppression diode 40, and an output transistor 41. Then connected to transistor 41 there is an output device consisting of a double transistor 42 and a field absorbing diode 43 joined to double transistor 42. The typical connections of this type regulator to test unit 10 is also shown in FIG. 6.

In the test and operation of the invention, the positive terminal of battery 27 provides, via ignition terminal 17, the positive voltage for the collector of transistor 41 in the unit under test. Battery 27 positive voltage is also supplying, via terminals 19, 23 the bias voltage for transistor 41, and the collector of the output transistor 42 is connected to the negative terminal of the test meter 13 via the field terminals 18, 22. Ground reference for the circuit under test and the battery supply voltage is by way of the ground terminal 20, 21.

To perform a test, one of the regulators is pressed against the terminals built into the face of case 12, and held there with the fingers of one hand while the merit switch 24 is pressed. The normally open contacts 30 and ground of the merit switch 24 are closed providing continuity for the supply voltage from batteries 27 and 29 to be applied to the regulator under test. Under normal conditions, the positive voltage applied to the collector of transistor 41 causes the output transistor 42 to conduct and act as a short, immediately placing meter 13 across batteries 27 and 29. During the instant that the transistor 42 is on, meter 13 will indicate between 15 and 18 volts on the color-coded scale 15.

As soon as zener diode 39 breakdown voltage is reached, transistor 41 will conduct placing the base voltage of the output transistor 42 below the level for conduction. With the transistor 42 cut off the meter needle 14 will drop to zero, thereby indicating that the components of the regulator under test all function normal. During the interval that the merit switch 24 was pressed, the capacitor 33 charged to the 15-18 volts of batteries 27 and 29 through the resistor 34.

When the merit switch 24 is released at the termination of the test, capacitor 33 discharges through the test completion indicator 25, causing the lamp to glow. As soon as the indicator 25 extinguishes the test cycle may be repeated by pressing merit switch 24 again.

Thus, a good unit under test will result if the battery check switch 26 has previously been pressed, momentarily, so that meter 13 will show that the battery potential of batteries 27 and 29 will register at least a total of 15 volts, shown in area 16, as green, on scale 16.5.

Any abnormal solid state voltage regulator will result in meter 13 either never moving off zero, or holding a voltage reading, instead of dropping back to zero. If the meter 13 does not move off zero at all, it indicates that the output transistor 42 of the unit under test is open, or unable to conduct. If meter needle 14 moves to the red scale (above or below area 16) and holds there, the output transistor 42 is shorted or stays in conduction due to a malfunctioning transistor 41, as not conducting.

Therefore, the apparatus results in a reliable, simple and quick "go, no go", indicating the state of the unit under test.

A normal indication on meter 13 whereby the needle 14 momentarily indicates 13.8-14.2 volts (above area 16), then immediately drops back to zero, ensures that all components in the unit under test are functioning normally. The failure of any component in the unit under test that would prevent normal operation in the automotive electrical system will cause an abnormal indication on the meter 13 where the needle 14 never moves off zero, indicating the unit under test is open, or it moves to some position on the scale 15, and remains there as long as merit switch 24 is pressed, then the unit under test is shorted.

Having thus described the preferred embodiment of the invention, it should be understood that numerous structural modifications and adaptations may be resorted to without departing from the spirit of the invention.

What is claimed is:

1. A battery powered voltage regulator tester wherein the batteries provide a source of potential, including a plurality of contacts spaced to fit the particular regulator under test, a switch to apply the potential to the regulator comprising a pressure operated blade and a plurality of normally open contacts, and a capacitance and a bulb connected across a pair of said switch contacts wherein the capacitance developed in testing is discharged through the bulb to flash said bulb when said switch is deactivated, and a meter which indicates the amount of potential used by the regulator.

2. The device of claim 1 further including a second switch to connect the batteries to the meter to thereby indicate the charge on the batteries.

3. The device of claim 2 wherein said first and second switches are pressure activated.

4. The device of claim 1 in which said meter is color coded to provide areas of demarkation which denote functional and faulty voltage regulators.

* * * * *